(12) United States Patent
Lee et al.

(10) Patent No.: US 11,566,176 B2
(45) Date of Patent: Jan. 31, 2023

(54) SEMICONDUCTOR NANOCRYSTAL PARTICLES AND DEVICES INCLUDING THE SAME

(71) Applicant: SAMSUNG ELECTRONICS CO., LTD., Suwon-si (KR)

(72) Inventors: Jeong Hee Lee, Seongnam-si (KR); Hyo Sook Jang, Suwon-si (KR); Sung Woo Kim, Hwaseong-si (KR); Jin A Kim, Suwon-si (KR); Tae Hyung Kim, Seoul (KR); Yuho Won, Seoul (KR); Eun Joo Jang, Suwon-si (KR); Yong Seok Han, Anyang-si (KR)

(73) Assignee: SAMSUNG ELECTRONICS CO., LTD., Gyeonggi-Do (KR)

(*) Notice: Subject to any disclaimer, the term of this patent is extended or adjusted under 35 U.S.C. 154(b) by 354 days.

(21) Appl. No.: 16/851,495

(22) Filed: Apr. 17, 2020

(65) Prior Publication Data
US 2020/0332189 A1   Oct. 22, 2020

(30) Foreign Application Priority Data
Apr. 19, 2019   (KR) .................. 10-2019-0046357

(51) Int. Cl.
| | |
|---|---|
| *C09K 11/88* | (2006.01) |
| *H01L 33/00* | (2010.01) |
| *H01L 33/28* | (2010.01) |
| *H01L 33/06* | (2010.01) |

(52) U.S. Cl.
CPC ........ *C09K 11/883* (2013.01); *H01L 33/0062* (2013.01); *H01L 33/06* (2013.01); *H01L 33/28* (2013.01)

(58) Field of Classification Search
CPC ..... H01L 33/0062; H01L 33/06; H01L 33/28; C09K 11/025; C09K 11/0811; C09K 11/565; C09K 11/883; B82Y 30/00
See application file for complete search history.

(56) References Cited

U.S. PATENT DOCUMENTS 8,859,442 B2 * 10/2014 Naasani ............... C09K 11/883
                                                         438/782

FOREIGN PATENT DOCUMENTS

| CN | 103881723 A | 6/2014 |
|---|---|---|
| CN | 106129176 A | 11/2016 |
| CN | 106753326 A | 5/2017 |

(Continued)

OTHER PUBLICATIONS

D. J. Norris et al., "High-Quality Manganese-Doped ZnSe Nanocrystals," Nano Letters, 2001, pp. 3-7, vol. 1, No. 1.

(Continued)

*Primary Examiner* — Brook Kebede
(74) *Attorney, Agent, or Firm* — Cantor Colburn LLP

(57) ABSTRACT

A semiconductor nanocrystal particle including a core including a first semiconductor nanocrystal including zinc (Zn) and sulfur (S), selenium (Se), tellurium (Te), or a combination thereof; and a shell including a second semiconductor nanocrystal disposed on at least a portion of the core,
wherein the core includes a dopant of a Group 1A element, a Group 2A element, or a combination thereof, and
the semiconductor nanocrystal particle exhibits a maximum peak emission in a wavelength region of about 440 nanometers (nm) to about 470 nm.

20 Claims, 5 Drawing Sheets

(56) References Cited

FOREIGN PATENT DOCUMENTS

| | | | | |
|---|---|---|---|---|
| CN | 108048093 A | 5/2018 | | |
| EP | 3275967 A1 * | 1/2018 | ............ | B82Y 20/00 |
| JP | H05343743 A | 12/1993 | | |
| JP | H1053497 A | 2/1998 | | |
| JP | 2004158528 A | 6/2004 | | |
| KR | 20160098000 A | 8/2016 | | |

OTHER PUBLICATIONS

Jason K. Cooper et al., "Tunable Photoluminescent Core/Shell Cu+-Doped ZnSe/ZnS Quantum Dots Codoped with Al3+, Ga3+, or In3+," ACS Applied Materials & Interfaces, Apr. 20, 2015, pp. 10055-10066, vol. 7.

Yoichi Yamada et al., "Bound-Exciton and Edge-Emission Spectra Associated with Li and Na Acceptors in ZnSe," Japanese Journal of Applied Physics, Apr. 13, 1989, pp. L837-L840, vol. 28, No. 5.

\* cited by examiner

SEMICONDUCTOR NANOCRYSTAL PARTICLES AND DEVICES INCLUDING THE SAME

CROSS-REFERENCE TO RELATED APPLICATION

This application claims priority to and the benefit of Korean Patent Application No. 10-2019-0046357 filed in the Korean Intellectual Property Office on Apr. 19, 2019, and all the benefits accruing therefrom under 35 U.S.C. § 119, the content of which in its entirety is herein incorporated by reference.

BACKGROUND

1. Field

Semiconductor nanocrystal particles and devices including the same are disclosed.

2. Description of the Related Art

Physical characteristics (e.g., energy bandgaps, melting points, etc.) of nanoparticles that are intrinsic characteristics may be controlled by changing particle sizes of the nanoparticles, unlike bulk materials. For example, semiconductor nanocrystal particles also referred to as quantum dots are a crystalline material having a size of several nanometers. Such semiconductor nanocrystal particles have a small size and a large surface area per unit volume and exhibit quantum confinement effects, and thus have different properties from the characteristics of bulk materials having the same composition. Quantum dots may absorb light from an excitation source and become excited, and may emit energy corresponding to energy bandgaps of the quantum dots.

Quantum dots may be synthesized using a vapor deposition method of metal organic chemical vapor deposition (MOCVD), molecular beam epitaxy (MBE), and the like, a wet chemical method of adding precursor materials to an organic solvent to grow crystals, and the like. In the wet chemical method, organic compounds such as ligands/coordinating solvents may be coordinated on, e.g., bound to, surfaces of nanocrystals to control a crystal growth during the crystal growth.

A core/shell structure may improve photoluminescence properties of quantum dots, but core/shell quantum dots having desirable properties may be cadmium-based materials. Accordingly, development of cadmium-free semiconductor nanocrystal particles having desirable photoluminescence properties is desired.

SUMMARY

An embodiment provides a cadmium-free semiconductor nanocrystal particle capable of emitting blue light with improved efficiency.

An embodiment provides a method of producing the aforementioned semiconductor nanocrystal particle.

An embodiment provides an electronic device including the aforementioned semiconductor nanocrystal particle.

According to an embodiment, a semiconductor nanocrystal particle includes a core including a first semiconductor nanocrystal including zinc (Zn) and sulfur (S), selenium (Se), tellurium (Te), or a combination thereof; and a shell including a second semiconductor nanocrystal disposed on at least a portion of the core, wherein the core includes a dopant of a Group 1A element, a Group 2A element, or a combination thereof, and the semiconductor nanocrystal particle exhibits a maximum peak emission in a wavelength region of about 440 nanometers (nm) to about 470 nm.

A mole ratio of the dopant relative to the zinc may be less than or equal to about 0.03:1.

A content of the dopant may be less than or equal to about 0.1 weight percent (wt %), based on a total weight of the semiconductor nanocrystal particle.

A size of the core may range from about 3 nm to about 15 nm.

The first semiconductor nanocrystal may include a semiconductor nanocrystal including zinc (Zn) and selenium (Se); a semiconductor nanocrystal including zinc (Zn), selenium (Se), and tellurium (Te); a semiconductor nanocrystal including zinc (Zn), sulfur (S), and selenium (Se), tellurium (Te), or a combination thereof; or a combination thereof.

The second semiconductor nanocrystal may include a Group II-VI compound, a Group III-V compound, a Group IV-VI compound, a Group IV element or compound, a Group compound, a Group I—II-IV-VI compound, or a combination thereof.

The second semiconductor nanocrystal may include zinc (Zn); and sulfur (S), selenium (Se), tellurium (Te), or a combination thereof.

The shell may include a plurality of layers and adjacent layers of the plurality of layers may include different semiconductor nanocrystals.

The shell may include a first layer disposed directly on the core and an outermost layer, wherein the first layer may include ZnSeS and the outermost layer may include ZnS.

The maximum peak emission may have a full width at half maximum (FWHM) of less than or equal to about 30 nm.

The semiconductor nanocrystal particle may have quantum efficiency of greater than or equal to about 60%.

The semiconductor nanocrystal particle may have a size of greater than or equal to about 4 nm to about 50 nm.

The semiconductor nanocrystal particle may not include cadmium.

According to an embodiment, a method of producing a semiconductor nanocrystal particle includes preparing a first core precursor solution including a zinc precursor and an organic ligand;

preparing a second core precursor including sulfur (S), selenium (Se), tellurium (Te), or a combination thereof;

preparing a first shell precursor solution including a first shell precursor including a metal and an organic ligand;

preparing a second shell precursor including a non-metal element;

heating the first core precursor solution to a first reaction temperature, adding the second core precursor, and optionally an organic ligand to form a core including a first semiconductor nanocrystal including zinc (Zn) and sulfur (S), selenium (Se), tellurium (Te), or a combination thereof;

adding a dopant precursor including a dopant of a Group 1A element, a Group 2A element, or a combination thereof, and optionally an organic ligand to the first core precursor solution to obtain a mixture, heating the mixture to a second reaction temperature, and adding the core including the first semiconductor nanocrystal, the second core precursor, and optionally an organic ligand to grow the core; and adding the first shell precursor solution and the second shell precursor to the core and reacting them to form a shell including a second semiconductor nanocrystal.

The method may include separating the core including the first semiconductor nanocrystal core and dispersing the core in an organic solvent to prepare a core solution.

The zinc precursor may include a Zn metal powder, ZnO, an alkylated Zn compound, a Zn alkoxide, a Zn carboxylate, a Zn nitrate, a Zn perchlorate, a Zn sulfate, a Zn acetylacetonate, a Zn halide, a Zn cyanide, a Zn hydroxide, or a combination thereof.

The second core precursor may be alkyl phosphine including sulfur (S), selenium (Se), or tellurium (Te) or aryl phosphine including sulfur (S), selenium (Se), or tellurium (Te).

The first shell precursor may include zinc and the second shell precursor may include sulfur (S), selenium (Se), tellurium (Te), or a combination thereof.

The organic ligand may include RCOOH, $RNH_2$, $R_2NH$, $R_3N$, RSH, $RH_2PO$, $R_2HPO$, $R_3PO$, $RH_2P$, $R_2HP$, $R_3P$, ROH, RCOOR, $RPO(OH)_2$, RHPOOH, RHPOOH, or a combination thereof, wherein each R is the same or different and is independently hydrogen, a C1 to C24 substituted or unsubstituted aliphatic hydrocarbon, a C6 to C20 substituted or unsubstituted aromatic hydrocarbon, or a combination thereof, provided that at least one R is not hydrogen.

According to an embodiment, an electronic device includes the aforementioned semiconductor nanocrystal particle.

The electronic device may be a display device, a light emitting diode (LED), a quantum dot light emitting diode (QLED), an organic light emitting diode (OLED), a sensor, an image sensor, or a solar cell.

A cadmium-free semiconductor nanocrystal particle capable of emitting blue light is provided. The semiconductor nanocrystal particle may be applied to, e.g., used in, various display devices, biolabeling (biosensor, bioimaging), a photodetector, a solar cell, a hybrid composite, and the like.

BRIEF DESCRIPTION OF THE DRAWINGS

The above and other advantages and features of this disclosure will become more apparent by describing in further detail exemplary embodiments thereof with reference to the accompanying drawings, in which.

DETAILED DESCRIPTION

Figure 1:
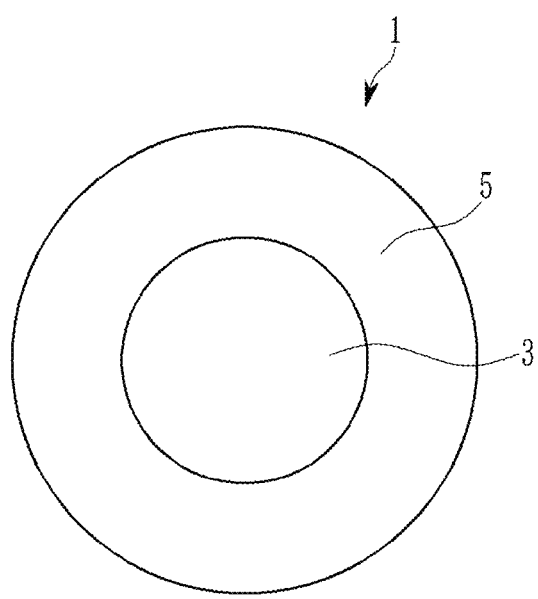
FIG. 1 is a schematic cross-sectional view of a semiconductor nanocrystal particle according to an embodiment.

Advantages and characteristics of this disclosure, and a method for achieving the same, will become evident referring to the following example embodiments together with the drawings attached hereto. However, the embodiments should not be construed as being limited to the embodiments set forth herein. If not defined otherwise, all terms (including technical and scientific terms) in the specification may be defined as commonly understood by one skilled in the art. The terms defined in a generally-used dictionary may not be interpreted ideally or exaggeratedly unless clearly defined. In addition, unless explicitly described to the contrary, the word "comprise" and variations such as "comprises" or "comprising," will be understood to imply the inclusion of stated elements but not the exclusion of any other elements.

Further, the singular includes the plural unless mentioned otherwise.

In the drawings, the thickness of layers, films, panels, regions, etc., are exaggerated for clarity. Like reference numerals designate like elements throughout the specification.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer, or section. Thus, "a first element," "component," "region," "layer," or "section" discussed below could be termed a second element, component, region, layer, or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/ or components, but do not preclude the presence or addition of one or more other features, regions, integers, steps, operations, elements, components, and/or groups thereof.

"About" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

As used herein, when a definition is not otherwise provided, "substituted" refers to a compound or a moiety wherein a, e.g., at least one, hydrogen atom thereof is replaced by a substituent of a C1 to C30 alkyl group, a C2 to C30 alkenyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, a C2 to C30 heterocycloalkyl group, a halogen (—F, —Cl, —Br, or —I), a hydroxy group (—OH), a nitro group (—NO$_2$), a cyano group (—CN), an amino group (—NRR', wherein R and R' are independently hydrogen or a C1 to C6 alkyl group), an azido group (—N$_3$), an amidino group (—C(=NH)NH$_2$)), a hydrazino group (—NHNH$_2$), a hydrazono group (=N(NH$_2$)), an aldehyde group (—C(=O)H), a carbamoyl group (—C(O)NH$_2$), a thiol group (—SH), an ester group (—C(=O)OR, wherein R is a C1 to C6 alkyl group or a C6 to C12 aryl group), a carboxyl group (—COOH) or a salt thereof (—C(=O)OM, wherein M is an organic or inorganic cation), a sulfonic acid group (—SO$_3$H) or a salt thereof (—SO$_3$M, wherein M is an organic or inorganic cation), a phosphoric acid group (—PO$_3$H$_2$) or a salt thereof (—PO$_3$MH or —PO$_3$M$_2$, wherein M is an organic or inorganic cation), or a combination thereof.

Herein, "aliphatic" refers to saturated or unsaturated linear or branched hydrocarbon group. The aliphatic group may be, for example, an alkyl group, an alkenyl group, or an alkynyl group.

Herein, "aromatic" refers to an organic compound or group including a, e.g., at least one, unsaturated cyclic group having delocalized pi electrons. The term may include aromatic compounds, heteroaromatic compounds, or a combination thereof.

Herein, a hydrocarbon group refers to a group including carbon and hydrogen (e.g., an alkyl, alkenyl, alkynyl, or aryl group). The hydrocarbon group may be a group having a monovalence or greater formed by removal of one or more hydrogen atoms from, alkane, alkene, alkyne, or arene. In the hydrocarbon group, a, e.g., at least one, methylene may be replaced by an oxide moiety, a carbonyl moiety, an ester moiety, —NH—, or a combination thereof.

Herein, "alkyl" refers to a linear or branched saturated monovalent hydrocarbon group (methyl, ethyl hexyl, etc.).

Herein, "alkenyl" refers to a linear or branched monovalent hydrocarbon group having one or more carbon-carbon double bond.

Herein, "alkynyl" refers to a linear or branched monovalent hydrocarbon group having one or more carbon-carbon triple bond.

Herein, "aryl" refers to a group formed by removal of a, e.g., at least one, hydrogen from an aromatic group (e.g., a phenyl or a naphthyl group).

Herein, "hetero" refers to one including one or more (e.g., 1 to 3) heteroatom of N, O, S, Si, P, or a combination thereof.

Herein, "Group" refers to a group of Periodic Table.

Semiconductor nanocrystal particles (hereinafter, also referred to as quantum dots) may absorb light from an excitation source and may emit energy corresponding to energy bandgaps of the semiconductor nanocrystal particles. Energy bandgaps of quantum dots may be changed according to sizes and compositions of quantum dots. For example, as the sizes of quantum dots increase, the quantum dots may have narrow energy bandgaps and increased emission wavelengths. Semiconductor nanocrystals may be used as light emitting materials in various fields such as in a display device, an energy device, or a bio light emitting device.

Quantum dots having photoluminescence properties at a desirable level may be based on cadmium (Cd). Cadmium may cause severe environment/health problems and is a restricted element by Restriction of Hazardous Substances Directive (RoHS) in a plurality of countries. Accordingly, there are development of a cadmium-free quantum dot having improved photoluminescence characteristics is desired. On the other hand, in order to be applied to, e.g., used in, a QLED display device, a quantum dot having a relatively narrow full width at half maximum (FWHM) and capable of emitting light of pure blue (e.g., a photoluminescence (PL) peak at about 450 nm to about 460 nm, for example about 455 nm) is desired.

For example, a blue light emitting material is desired in order to be applied to, e.g., used in, a display device having a relatively high (e.g., about 90% or greater, for example about 95% or greater) color reproducibility based on the next generation color standard BT2020. Provided is a cadmium-free quantum dot having photoluminescence properties at a desirable level and the aforementioned PL peak.

A semiconductor nanocrystal particle according to an embodiment may not include cadmium while emitting blue light. In addition, the semiconductor nanocrystal particle may have a core/shell structure and maintain a narrow full width at half maximum (FWHM) while maintain improved quantum efficiency.

Hereinafter, referring to FIG. 1, a semiconductor nanocrystal particle according to an embodiment is described.

FIG. 1 is a schematic cross-sectional view of a semiconductor nanocrystal particle according to an embodiment.

Referring to FIG. 1, a semiconductor nanocrystal particle 1 includes a core 3 including a first semiconductor nanocrystal including zinc (Zn) and a, e.g., at least one, chalcogen of sulfur (S), selenium (Se), tellurium (Te), or a combination thereof; and a shell 5 including a second semiconductor nanocrystal disposed on at least a portion of the core 3, the core includes a, e.g., at least one, dopant of a Group 1A element, a Group 2A element, or a combination thereof, and the semiconductor nanocrystal particle exhibits a maximum peak emission in a wavelength region of about 440 nm to about 470 nm.

The first semiconductor nanocrystal included in the core 3 may include zinc (Zn) and a, e.g., at least one, chalcogen of sulfur (S), selenium (Se), tellurium (Te), or a combination thereof, and may be a semiconductor nanocrystal including zinc (Zn) and selenium (Se); a semiconductor nanocrystal including zinc (Zn), selenium (Se), and tellurium (Te); a semiconductor nanocrystal including zinc (Zn), sulfur (S), and selenium (Se), tellurium (Te), or a combination thereof; or a combination thereof.

By doping the first semiconductor nanocrystal with a, e.g., at least one, dopant of a Group 1A element, a Group 2A element, or a combination thereof, a wavelength region of the maximum peak emission of the semiconductor nanocrystal particle 1 may be about 440 nm to about 470 nm, for example, about 440 nm to about 460 nm.

In the core 3, a mole ratio of the dopant relative to the zinc may be less than or equal to about 0.03:1, for example 0.025:1, less than or equal to about 0.024:1, less than or equal to about 0.023:1, less than or equal to about 0.022:1, less than or equal to about 0.021:1, less than or equal to about 0.02:1, less than or equal to about 0.019:1, less than or equal to about 0.018:1, less than or equal to about 0.017:1, less than or equal to about 0.016:1, less than or equal to about 0.015:1, less than or equal to about 0.014:1, less than or equal to about 0.013:1, less than or equal to about 0.012:1, less than or equal to about 0.011:1, less than or equal to about 0.01:1, or less than or equal to about 0.005:1. In the core 3, a mole ratio of the dopant relative to the zinc may be greater than or equal to about 0.001:1, for example greater than or equal to about 0.002:1. Within the disclosed ranges, the semiconductor nanocrystal particle may exhibit maximum peak emission in a wavelength region of about 440 nm to about 470 nm while maintaining a narrow full width at half maximum (FWHM) of less than or equal to about 30 nm and greatly improving the quantum efficiency. The mole ratio may be measured by inductively coupled plasma atom emission spectrometry (ICP-AES).

A content of the dopant may be less than or equal to about 0.1 wt %, for example less than or equal to about 0.05 wt %, or less than or equal to about 0.03 wt %, based on a total weight of the semiconductor nanocrystal particle. In addition, the content of the dopant may be greater than or equal to about 0 wt %, for example greater than or equal to about 0.01 wt %, based on a total weight of the semiconductor nanocrystal particle. Within the disclosed ranges, the semiconductor nanocrystal particle 1 may exhibit maximum peak emission in a wavelength region of about 440 nm to about 470 nm while maintaining a narrow full width at half maximum (FWHM) of less than or equal to about 30 nm and greatly improving the quantum efficiency.

The core 3 may have a size, for example an average size of greater than or equal to about 3 nm, for example greater than or equal to about 4 nm, or greater than or equal to about 5 nm and less than or equal to about 15 nm, for example, less than or equal to about 14 nm, less than or equal to about 13 nm, or less than or equal to about 12 nm.

The first semiconductor nanocrystal may be a semiconductor nanocrystal including zinc (Zn) and selenium (Se); a semiconductor nanocrystal including zinc (Zn), selenium (Se), and tellurium (Te); a semiconductor nanocrystal including zinc (Zn), sulfur (S), and selenium (Se), tellurium (Te), or a combination thereof; or a combination thereof. The first semiconductor nanocrystal may be ZnSe, ZnTeSe, ZnSeS, or ZnTeSeS.

In the semiconductor nanocrystal including zinc (Zn), selenium (Se), and tellurium (Te), a content (e.g., number of moles or weight) of the zinc (Zn) may be larger than that of the selenium (Se). In addition, the content of the zinc may be larger than that of the tellurium (Te). The content of the zinc (Zn) may be larger than that of the selenium (Se) and the content of selenium (Se) may be larger than that of tellurium (Te). A mole ratio of the tellurium (Te) relative to the selenium (Se) may be less than or equal to about 0.05:1, less than or equal to about 0.049:1, less than or equal to about 0.048:1, less than or equal to about 0.047:1, less than or equal to about 0.045:1, less than or equal to about 0.044:1, less than or equal to about 0.043:1, less than or equal to about 0.042:1, less than or equal to about 0.041:1, less than or equal to about 0.04:1, less than or equal to about 0.039:1, less than or equal to about 0.035:1, less than or equal to about 0.03:1, less than or equal to about 0.029:1, less than or equal to about 0.025:1, less than or equal to about 0.024:1, less than or equal to about 0.023:1, less than or equal to about 0.022:1, less than or equal to about 0.021:1, less than or equal to about 0.02:1, less than or equal to about 0.019:1, less than or equal to about 0.018:1, less than or equal to about 0.017:1, less than or equal to about 0.016:1, less than or equal to about 0.015:1, less than or equal to about 0.014:1:1, less than or equal to about 0.013, less than or equal to about 0.012:1, less than or equal to about 0.011:1, or less than or equal to about 0.01:1. In addition the mole ratio of the tellurium (Te) relative to the selenium (Se) may be greater than or equal to about 0.001:1, greater than or equal to about 0.002:1, greater than or equal to about 0.003:1, greater than or equal to about 0.004:1, greater than or equal to about 0.005:1, greater than or equal to about 0.006:1, or greater than or equal to about 0.007:1.

The second semiconductor nanocrystal included in the shell 5 may include a Group II-VI compound, a Group III-V compound, a Group IV-VI compound, a Group IV element or compound, a Group compound, a Group I-II-IV-VI compound, or a combination thereof. The Group II-VI compound may be a binary element compound of CdSe, CdTe, ZnS, ZnSe, ZnTe, ZnO, HgS, HgSe, HgTe, MgSe, MgS, or a combination thereof; a ternary element compound of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, or a combination thereof; a quaternary element compound of HgZnTeS, CdZnSeS, CdZnSeTe, CdZnSTe, CdHgSeS, CdHgSeTe, CdHgSTe, HgZnSeS, HgZnSeTe, HgZnSTe, or a combination thereof; or a combination thereof. The Group III-V compound may be a binary element compound of GaN, GaP, GaAs, GaSb, AlN, AlP, AlAs, AlSb, InN, InP, InAs, InSb, or a combination thereof; a ternary element compound of GaNP, GaNAs, GaNSb, GaPAs, GaPSb, AlNP, AlNAs, AlNSb, AlPAs, AlPSb, InNP, InNAs, InNSb, InPAs, InPSb, or a combination thereof; a quaternary element compound of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or a combination thereof; or a combination thereof. The Group IV-VI compound may be a binary element compound of SnS, SnSe, SnTe, PbS, PbSe, PbTe, or a combination thereof; a ternary element compound of SnSeS, SnSeTe, SnSTe, PbSeS, PbSeTe, PbSTe, SnPbS, SnPbSe, SnPbTe, or a combination thereof; a quaternary element compound of SnPbSSe, SnPbSeTe, SnPbSTe, or a combination thereof; or a combination thereof. Examples of the Group compound may include $CuInSe_2$, $CuInS_2$, CuInGaSe, and CuInGaS, but are not limited thereto. Examples of the Group I-II-IV-VI compound may include CuZnSnSe and CuZnSnS, but are not limited thereto. The Group IV element or compound may be a singular element material of Si, Ge, or a combination thereof; a binary element compound of SiC, SiGe, or a combination thereof; or a combination thereof. The Group III-V compound may further include a Group II metal (e.g., InZnP, etc.)

The shell 5 may be a multi-layered shell including a plurality of layers. Adjacent layers of the plurality of layers may include semiconductor materials having different compositions from each other. The shell 5 may be a gradient alloy having a composition that is changed in a radial direction.

The shell 5 may have a thickness of greater than or equal to about 0.5 nm, greater than or equal to about 1 nm, greater than or equal to about 2 nm, greater than or equal to about 3 nm, greater than or equal to about 4 nm, or greater than or equal to about 5 nm. The shell 5 may have a thickness of less than or equal to about 10 nm, less than or equal to about 9 nm, less than or equal to about 8 nm, less than or equal to about 7 nm, less than or equal to about 6 nm, less than or equal to about 5 nm, or less than or equal to about 4 nm.

The thickness of the shell 5 may be determined from the size of the core and the size of the semiconductor nanocrystal.

In an embodiment, the second semiconductor nanocrystal may include zinc (Zn); and sulfur (S), selenium (Se), tellurium (Te), or a combination thereof.

The shell 5 may be a multi-layered shell and may be a multi-layered shell of two layers, three layers, four layers or more. The multi-layered shell may include a first layer disposed directly on the core and outermost layer and the first layer may include ZnSeS and the outermost layer may include ZnS. The shell may be a gradient alloy and an amount (e.g., number of moles or weight) of sulfur may have a concentration gradient that increases with an increasing distance from the core.

For example, a mole ratio of Se relative to Zn may be less than about 1:1, for example, less than or equal to about 0.95:1, less than or equal to about 0.90:1, less than or equal to about 0.85:1, or less than or equal to about 0.8:1. The mole ratio may be confirmed by ICP-AES analysis.

For example, a mole ratio of Te relative to Zn may be less than or equal to about 0.03:1, for example, less than or equal to about 0.027:1, less than or equal to about 0.025:1, less than or equal to about 0.02:1, less than or equal to about 0.019:1, less than or equal to about 0.018:1, less than or equal to about 0.017:1, less than or equal to about 0.016:1, less than or equal to about 0.015:1, less than or equal to about 0.014:1, less than or equal to about 0.013:1, less than or equal to about 0.012:1, less than or equal to about 0.011:1, less than or equal to about 0.010:1, less than or equal to about 0.009:1, less than or equal to about 0.008:1, less than or equal to about 0.007:1, less than or equal to about 0.006:1, or less than or equal to 0.005:1. The mole ratio of Te relative to Zn may be greater than or equal to about 0.001:1, greater than or equal to about 0.002:1, or greater than or equal to about 0.003:1. The mole ratio may be confirmed by ICP-AES analysis.

In a semiconductor nanocrystal particle according to an embodiment, an amount of tellurium may be less than or equal to about 1 wt %, based on a total weight of the semiconductor nanocrystal particle. The semiconductor nanocrystal particle may not include cadmium.

The semiconductor nanocrystal particle may have any suitable shape, for example a sphere, a polygon, a multipod, and the like. The multipod may have at least two (e.g., at least three or at least four) branch parts and a valley part therebetween.

The semiconductor nanocrystal particle may have a size of greater than or equal to about 4 nm, for example greater than or equal to about 5 nm, or greater than or equal to 6 nm. The semiconductor nanocrystal particle may have a size of less than or equal to about 50 nm, for example, less than or equal to about 45 nm, less than or equal to about 40 nm, less than or equal to about 35 nm, less than or equal to about 30 nm, less than or equal to about 25 nm, less than or equal to about 24 nm, less than or equal to about 23 nm, less than or equal to about 22 nm, less than or equal to about 21 nm, less than or equal to about 20 nm, less than or equal to about 19 nm, less than or equal to about 18 nm, less than or equal to about 17 nm, or less than or equal to about 16 nm. Herein, the size of the semiconductor nanocrystal particle may be a diameter. When the semiconductor nanocrystal particle has a polygonal or multipod shape, the size of the semiconductor nanocrystal particle may be the largest linear length crossing the particle. The sizes of the core or semiconductor nanocrystal particle may be for example determined by a transmission electron microscopic analysis, but are not limited thereto.

A semiconductor nanocrystal particle according to an embodiment may emit blue light having maximum peak emission in a wavelength of greater than or equal to about 440 nm, for example, greater than or equal to about 441 nm, greater than or equal to about 443 nm, greater than or equal to about 445 nm, or greater than or equal to about 450 nm and less than or equal to about 470 nm, for example, less than about 470 nm, less than or equal to about 465 nm, or less than or equal to about 460 nm. In an embodiment, the blue light may exhibit maximum peak emission in a wavelength region of about 440 nm to about 460 nm.

The maximum peak emission may have a full width at half maximum (FWHM) of less than or equal to about 30 nm, for example, less than or equal to about 29 nm, less than or equal to about 28 nm, less than or equal to about 27 nm, less than or equal to about 26 nm, less than or equal to about 25 nm, less than or equal to about 24 nm, less than or equal to about 23 nm, less than or equal to about 22 nm, less than or equal to about 21 nm, less than or equal to about 20 nm, less than or equal to about 19 nm, less than or equal to about 18 nm, less than or equal to about 17 nm, less than or equal to about 16 nm, less than or equal to about 15 nm, less than or equal to about 14 nm, less than or equal to about 13 nm, or less than or equal to about 12 nm.

The semiconductor nanocrystal particle may have quantum efficiency of greater than or equal to about 60%, for example, greater than or equal to about 61%, greater than or equal to about 62%, greater than or equal to about 63%, greater than or equal to about 64%, greater than or equal to about 65%, greater than or equal to about 66%, greater than or equal to about 67%, greater than or equal to about 68%, or greater than or equal to about 69%. The semiconductor nanocrystal may have quantum efficiency of greater than or equal to about 80%, greater than or equal to about 90%, greater than or equal to about 95%, greater than or equal to about 99%, or about 100%.

Cadmium-based core/shell semiconductor nanocrystals such as CdSe/CdS may exhibit high photoluminescence properties and stability against photooxidation by passivation of the surface of the nanocrystal. Surfaces of cadmium-based core/shell semiconductor nanocrystals may include, e.g., be capped by, an inorganic shell having a wide bandgap. The inorganic shell may passivate the surface of the semiconductor nanocrystal, and effectively remove a dangling bond or a coordination portion that form a trap for carriers formed inside the semiconductor nanocrystal, and thus photo-generated carriers may be confined inside the core and relatively high luminous efficiency may be realized, e.g., exhibited. However, such a core/shell type semiconductor nanocrystal may have a maximum emission wavelength (i.e., a central emission wavelength) of about 470 nm to about 630 nm and it may be difficult for such a core/shell type semiconductor nanocrystal to have a maximum emission wavelength of less than about 470 nm. Because the maximum emission wavelength of the semiconductor nanocrystal particle increases in accordance with an increase of a size of the nanocrystal, a semiconductor nanocrystal core having a very small size (e.g., less than 1.6 nm) may obtain, e.g., exhibit, a maximum emission wavelength of less than 470 nm, but it may be difficult to produce the core having such a size with a narrow size distribution. During formation of the shell on the core, a maximum emission peak wavelength of a semiconductor nanocrystal particle may be increased (i.e., red-shift) and a full width at half maximum (FWHM) may also be increased and quantum efficiency may be decreased. Therefore, it may not be easy to prepare a core/shell semiconductor nanocrystal having blue light emission.

However, a semiconductor nanocrystal particle including a core having a relatively large size, for example, greater than or equal to about 3 nm, may exhibit a maximum emission peak in a wavelength region of less than or equal to about 470 nm, for example, or less than or equal to about 465 nm and a narrow full width at half maximum (FWHM) and high quantum efficiency.

According to an embodiment, a method of producing a semiconductor nanocrystal particle including preparing a first core precursor solution including a zinc precursor and an organic ligand;

preparing a second core precursor including a, e.g., at least one, chalcogen of sulfur (S), selenium (Se), tellurium (Te), or a combination thereof;

preparing a first shell precursor solution including a first shell precursor including a metal and an organic ligand;

preparing a second shell precursor including a non-metal element;

heating the first core precursor solution up to a first reaction temperature, adding the second core precursor, and optionally an organic ligand to form a core including a first semiconductor nanocrystal including zinc (Zn) and a, e.g., at least one, chalcogen of sulfur (S), selenium (Se), tellurium (Te), or a combination thereof;

adding a dopant precursor including a, e.g., at least one, dopant of a Group 1A element, a Group 2A element, or a combination thereof, and optionally an organic ligand to the first core precursor solution to obtain a mixture, heating the mixture up to a second reaction temperature, and adding the core including the first semiconductor nanocrystal, the second core precursor, and optionally an organic ligand to grow the core; and adding the first shell precursor solution and the second shell precursor to the core and reacting them to form a shell including a second semiconductor nanocrystal.

The method may include separating the core including the first semiconductor nanocrystal core and dispersing the core in an organic solvent to prepare a core solution.

The zinc precursor may include a Zn metal powder, ZnO, an alkylated Zn compound (e.g., C2 to C30 alkyl zinc (e.g., dialkyl zinc) such as dimethyl zinc, diethyl zinc, etc.), a Zn alkoxide (e.g., zinc ethoxide), a Zn carboxylate (e.g., zinc acetate or a zinc aliphatic carboxylate, for example a zinc long-chain aliphatic carboxylate such as zinc oleate), a Zn nitrate, a Zn perchlorate, a Zn sulfate, a Zn acetylacetonate, a Zn halide (e.g., a zinc chloride), a Zn cyanide, a Zn hydroxide, or a combination thereof. The zinc precursor solution may include two or more organic ligands in an organic solvent. The two or more organic ligands may include fatty acid and amine compounds. In a zinc precursor solution, a concentration of the zinc precursor and a concentration of the organic ligand are not particularly limited and may be appropriately selected.

The second core precursor may be alkyl phosphine including a chalcogen of sulfur (S), selenium (Se), or tellurium (Te) or aryl phosphine including a chalcogen of sulfur (S), selenium (Se), or tellurium (Te), but is not limited thereto.

The second core precursor may be a sulfur precursor of sulfur-trioctylphosphine (S-TOP), sulfur-tributylphosphine (S-TBP), sulfur-triphenylphosphine (S-TPP), sulfur-trioctylamine (S-TOA), bistrimethylsilyl sulfur, or a combination thereof; a selenium precursor of selenium-trioctylphosphine (Se-TOP), selenium-tributylphosphine (Se-TBP), selenium-triphenylphosphine (Se-TPP), selenium-diphenylphosphine (Se-DPP), or a combination thereof; or a tellurium precursor of tellurium-tributylphosphine (Te-TBP), tellurium-triphenylphosphine (Te-TPP), tellurium-diphenylphosphine (Te-DPP), or a combination thereof, but is not limited thereto.

The first reaction temperature may be greater than or equal to about 280° C., for example, greater than or equal to about 290° C. A reaction time for forming the core is not particularly limited and may be appropriately selected. For example, the reaction time may be greater than or equal to about 5 minutes, greater than or equal to about 10 minutes, greater than or equal to about 15 minutes, greater than or equal to about 20 minutes, greater than or equal to about 25 minutes, greater than or equal to about 30 minutes, greater than or equal to about 35 minutes, greater than or equal to about 40 minutes, greater than or equal to about 45 minutes, or greater than or equal to about 50 minutes, but is not limited thereto. For example, the reaction time may be less than or equal to about 2 hours, less than or equal to about 110 minutes, less than or equal to about 100 minutes, less than or equal to about 90 minutes, less than or equal to about 80 minutes, less than or equal to about 70 minutes, or less than or equal to about 60 minutes, but is not limited thereto. By adjusting the reaction time, the size of the core may be controlled.

After completing the reaction, a nonsolvent is added to reaction products to separate the produced core. The nonsolvent may be a polar solvent that is miscible with the solvent used in the core formation reactions and may not be capable of dispersing the produced core therein. The nonsolvent may be selected depending the solvent used in the reaction and may be for example acetone, ethanol, butanol, isopropanol, ethanediol, water, tetrahydrofuran (THF), dimethylsulfoxide (DMSO), diethylether, formaldehyde, acetaldehyde, ethylene glycol, a solvent having a similar solubility parameter to the foregoing solvents, or a combination thereof.

Then, in order to produce a core doped with a, e.g., at least one, dopant of a Group 1A element, a Group 2A element, or a combination thereof, a dopant precursor including a, e.g., at least one, dopant of a Group 1A element, a Group 2A element, or a combination thereof and optionally an organic ligand are added to the first core precursor solution and the obtained mixture is heated at a second reaction temperature.

The second reaction temperature may be greater than or equal to about 280° C., for example, may be greater than or equal to about 290° C.

The core including the first semiconductor nanocrystal, the second core precursor, and optionally an organic ligand are added to the mixture heated at the second reaction temperature and thereby the core is grown. A reaction time for growing the core is not particularly limited and may be appropriately selected. For example, the reaction time may be greater than or equal to about 5 minutes, greater than or equal to about 10 minutes, greater than or equal to about 15 minutes, greater than or equal to about 20 minutes, greater than or equal to about 25 minutes, greater than or equal to about 30 minutes, greater than or equal to about 35 minutes, greater than or equal to about 40 minutes, greater than or equal to about 45 minutes, or greater than or equal to about 50 minutes, but is not limited thereto. For example, the reaction time for growing the core may be less than or equal to about 2 hours, less than or equal to about 110 minutes, less than or equal to about 100 minutes, less than or equal to about 90 minutes, less than or equal to about 80 minutes, less than or equal to about 70 minutes, or less than or equal to or about 60 minutes, but is not limited thereto.

The core doped with a, e.g., at least one, dopant of a Group 1A element, a Group 2A element, or a combination thereof is produced by the aforementioned process.

A shell including the second semiconductor nanocrystal is formed on the core.

First, a first shell precursor solution including a first shell precursor including a metal and an organic ligand and a second shell precursor including a non-metal element are prepared.

In an embodiment, the first shell precursor may include zinc. The first shell precursor including zinc may be a zinc powder, an alkylated zinc (e.g., a C2 to C30 alkyl (e.g., dialkyl zinc)), a zinc alkoxide, a zinc carboxylate (or a zinc aliphatic carboxylate, for example a zinc long-chain aliphatic carboxylate such as zinc oleate), a zinc nitrate, a zinc perchlorate, a zinc sulfate, a zinc acetylacetonate, a zinc halide, a zinc cyanide, a zinc hydroxide, ZnO, zinc peroxide, or a combination thereof, but is not limited thereto. Examples of the first shell precursor may be dimethyl zinc, diethyl zinc, a zinc acetate, a zinc acetylacetonate, a zinc iodide, a zinc bromide, a zinc chloride, a zinc fluoride, a zinc carbonate, a zinc cyanide, a zinc nitrate, a zinc oxide, a zinc peroxide, a zinc perchlorate, a zinc sulfate, or a combination thereof.

The second shell precursor may include sulfur (S), selenium (Se), tellurium (Te) or a combination thereof.

The sulfur-containing precursor of the second shell precursor may include hexane thiol, octane thiol, decane thiol, dodecane thiol, hexadecane thiol, mercapto propyl silane, sulfur-trioctylphosphine (S-TOP), sulfur-tributylphosphine (S-TBP), sulfur-triphenylphosphine (S-TPP), sulfur-trioctylamine (S-TOA), bistrimethylsilyl sulfur, ammonium sulfide, sodium sulfide, or a combination thereof.

The selenium-containing precursor of the second shell precursor may include selenium-trioctylphosphine (Se-TOP), selenium-tributylphosphine (Se-TBP), selenium-triphenylphosphine (Se-TPP), selenium-diphenylphosphine (Se-DPP), or a combination thereof, but is not limited thereto.

The tellurium-containing precursor of the second shell precursor may include tellurium-trioctylphosphine (Te-TOP), tellurium-tributylphosphine (Te-TBP), tellurium-triphenylphosphine (Te-TPP), tellurium-diphenylphosphine (Te-DPP), or a combination thereof, but is not limited thereto.

The organic solvent may include a C6 to C22 primary amine such as a hexadecylamine, a C6 to C22 secondary amine such as dioctylamine, a C6 to C40 tertiary amine such as a trioctyl amine, a nitrogen-containing heterocyclic compound such as pyridine, a C6 to C40 olefin such as octadecene, a C6 to C40 aliphatic hydrocarbon such as hexadecane, octadecane, or squalane, an aromatic hydrocarbon substituted with a C6 to C30 alkyl group such as phenyldodecane, phenyltetradecane, or phenyl hexadecane, a primary, secondary, or tertiary phosphine (e.g., trioctyl phosphine) substituted with a, e.g., at least one, (e.g., 1, 2, or 3) C6 to C22 alkyl group, a phosphine oxide (e.g., trioctylphosphine oxide) such as (e.g., 1, 2, or 3) substituted with a C6 to C22 alkyl group, a C12 to C22 aromatic ether such as a phenyl ether or a benzyl ether, or a combination thereof.

The organic ligand may coordinate the surface of the produced nanocrystal and may have an effect on the light emitting and electrical characteristics as well as may well disperse the nanocrystal in the solution phase. The organic ligand may include RCOOH, RNH$_2$, R$_2$NH, R$_3$N, RSH, RH$_2$PO, R$_2$HPO, R$_3$PO, RH$_2$P, R$_2$HP, R$_3$P, ROH, RCOOR, RPO(OH)$_2$, RHPOOH, RHPOOH (wherein each R is the same or different and is independently hydrogen, a C1 to C24 substituted or unsubstituted aliphatic hydrocarbon, a C6 to C20 substituted or unsubstituted aromatic hydrocarbon, or a combination thereof, provided that at least one R is not hydrogen), or a combination thereof. Two or more different ligands may be used.

Specific examples of the organic ligand compound may be methane thiol, ethane thiol, propane thiol, butane thiol, pentane thiol, hexane thiol, octane thiol, dodecane thiol, hexadecane thiol, octadecane thiol, benzyl thiol; methyl amine, ethyl amine, propyl amine, butyl amine, pentyl amine, hexyl amine, octyl amine, dodecyl amine, hexadecyl amine, oleyl amine, octadecyl amine, dimethyl amine, diethyl amine, dipropyl amine; methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, benzoic acid, palmitic acid, stearic acid; a phosphine such as methyl phosphine, ethyl phosphine, propyl phosphine, butyl phosphine, pentyl phosphine, tributylphosphine, or trioctylphosphine; a phosphine oxide such as methyl phosphine oxide, ethyl phosphine oxide, propyl phosphine oxide, butyl phosphine oxide, or trioctylphosphine oxide; a diphenyl phosphine, a diphenyl phosphine oxide, a triphenyl phosphine, or a triphenyl phosphine oxide; phosphonic acid, and the like, but are not limited thereto. Two or more different organic ligand compound may be used. In an embodiment, the organic ligand compound may be a combination of RCOOH and amine (e.g., RNH$_2$, R$_2$NH, and/or R$_3$N, or a combination thereof).

The first shell precursor solution and second shell precursor are combined with the grown core and reacted to form a shell including a second semiconductor nanocrystal. Reaction conditions such as a reaction temperature, or time for shell formation is not particularly limited and may be appropriately selected. A shell formation reaction may be performed at the second reaction temperature for the core growth, or the reaction temperature may be controlled by further heating. The reaction time for shell formation may be greater than or equal to about 5 minutes, greater than or equal to about 10 minutes, greater than or equal to about 15 minutes, greater than or equal to about 20 minutes, greater than or equal to about 25 minutes, greater than or equal to about 30 minutes, greater than or equal to about 35 minutes, greater than or equal to about 40 minutes, greater than or equal to about 45 minutes, or greater than or equal to about 50 minutes, but is not limited thereto. For example, the reaction time for shell formation may be less than or equal to about 2 hours, less than or equal to about 110 minutes, less than or equal to about 100 minutes, less than or equal to about 90 minutes, less than or equal to about 80 minutes, less than or equal to about 70 minutes, or less than or equal to or about 60 minutes, but is not limited thereto.

After completing the reaction, a nonsolvent is added to reaction products and semiconductor nanocrystal particles coordinated with the ligand compound may be separated. The nonsolvent may be a polar solvent that is miscible with the solvent used in the core formation reaction, shell formation reaction, or a combination thereof and may not be capable of dispersing the produced semiconductor nanocrystal particles therein. The nonsolvent may be selected depending on the solvent used in the reaction and may be for example acetone, ethanol, butanol, isopropanol, ethanediol, water, tetrahydrofuran (THF), dimethylsulfoxide (DMSO), diethylether, formaldehyde, acetaldehyde, ethylene glycol, a solvent having a similar solubility parameter to the foregoing solvents, or a combination thereof. The semiconductor nanocrystal particles may be separated through centrifugation, sedimentation, chromatography, or distillation. The separated semiconductor nanocrystal particles may be added to a washing solvent and washed, if desired. The washing solvent has no particular limit and may have a similar solubility parameter to that of the ligand and may, for example, include hexane, heptane, octane, chloroform, toluene, benzene, and the like.

In an embodiment, an electronic device includes the aforementioned semiconductor nanocrystal particle. The device may include a display device, a light emitting diode (LED), an organic light emitting diode (OLED), a quantum dot LED, a sensor, a solar cell, an image sensor, or a liquid crystal display (LCD), but is not limited thereto.

In an embodiment, the electronic device may be a photoluminescence element (e.g., a lighting such as a quantum dot sheet or a quantum dot rail or a liquid crystal display (LCD)) or an electroluminescent device (e.g., QD LED device).

In an embodiment, the electronic device may include a quantum dot sheet and the aforementioned semiconductor nanocrystal particle may be included in the quantum dot sheet (e.g., in a form of a semiconductor nanocrystal-polymer composite).

Hereinafter, referring to FIGS. 2 to 4, electronic devices according to an embodiment are described.

Figure 2:
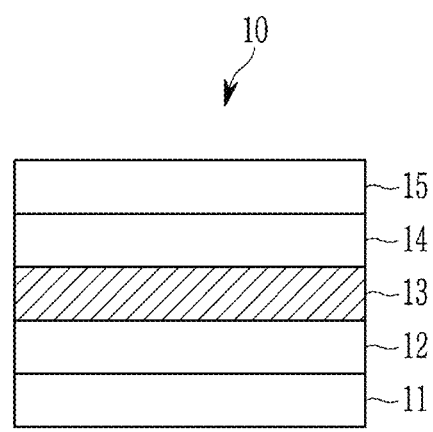
FIG. 2 is a schematic cross-sectional view of a quantum dot (QD) light emitting diode (LED) device according to an embodiment.

FIG. 2 is a schematic cross-sectional view of a QD LED device according to an embodiment.

Referring to FIG. 2, a QD LED device 10 may include an anode 11 and a cathode 15 facing each other and a quantum dot emission layer 13 disposed between the anode and the cathode and including a plurality of quantum dots, and the plurality of quantum dots may include the aforementioned blue light emitting semiconductor nanocrystal particles.

The anode 11 may include a hole injection conductor (e.g., having a relatively high work function). The cathode 15 may include an electron injection conductor (e.g., having a relatively low work function). The electron/hole injection conductor may include a metal-based material (aluminum, magnesium, tungsten, nickel, cobalt, platinum, palladium, calcium, LiF, and the like) (e.g., a metal, a metal compound, an alloy, a combination thereof), a metal oxide such as gallium indium oxide or indium tin oxide, or a conductive polymer such as polyethylene dioxythiophene (e.g., having a relatively high work function), but is not limited thereto.

The anode 11, the cathode 15, or a combination thereof may be a light transmitting electrode or a transparent electrode. In an embodiment, both the anode and the cathode may be light transmitting electrodes. The electrode may be patterned.

The light transmitting electrode may be made of, for example a transparent conductor such as indium tin oxide (ITO) or indium zinc oxide (IZO), gallium indium tin oxide, zinc indium tin oxide, titanium nitride, polyaniline, or LiF/Mg:Ag, or a metal thin film of a thin monolayer or multilayer, but is not limited thereto. When one of the cathode and the anode is a non-light transmitting electrode, the non-light transmitting electrode may be made of, for example, an opaque conductor such as aluminum (Al), a lithium aluminum (Li:Al) alloy, a magnesium-silver alloy (Mg:Ag), or a lithium fluoride-aluminum (LiF:Al).

The light transmitting electrode may be disposed on a transparent substrate (e.g., insulating transparent substrate). The substrate may be rigid or flexible. The substrate may be a plastic, glass, or a metal.

Thicknesses of the anode 11 and the cathode 15 are not particularly limited and may be appropriately selected considering device efficiency. For example, the thickness of the anode 11 or the cathode 15 may be greater than or equal to about 5 nm, for example, greater than or equal to about 50 nm, but is not limited thereto. For example, the thickness of the anode 11 or the cathode 15 may be less than or equal to about 100 micrometers (μm), for example, less than or equal to about 10 μm, less than or equal to about 1 μm, less than or equal to about 900 nm, less than or equal to about 500 nm, or less than or equal to about 100 nm, but is not limited thereto.

The quantum dot emission layer 13 includes a plurality of quantum dots. The plurality of quantum dots includes the blue light emitting semiconductor nanocrystal particle according to an embodiment. The quantum dot emission layer 13 may include a monolayer of the blue light emitting semiconductor nanocrystal particles.

The quantum dot emission layer 13 may be formed by applying a dispersion in which the quantum dots are dispersed in a solvent by spin coating, inkjet, or spray coating, and then drying the resultant. The emission layer may be formed to have a thickness of greater than or equal to about 5 nm, greater than or equal to about 10 nm, greater than or equal to about 15 nm, greater than or equal to about 20 nm, or greater than or equal to about 25 nm and, less than or equal to 100 nm for example, less than or equal to about 90 nm, less than or equal to about 80 nm, less than or equal to about 70 nm, less than or equal to about 60 nm, less than or equal to about 50 nm, less than or equal to about 40 nm, or less than or equal to about 30 nm.

The electronic device may include a charge auxiliary layer (hole auxiliary layer or electron auxiliary layer) between the anode 11 and the cathode 15. For example, the electronic device may include a hole auxiliary layer 12, an electron auxiliary layer 14, or a combination thereof between the anode 11 and the quantum dot emission layer 13, between the cathode 15 and the quantum dot emission layer 13, or a combination thereof. (refer to: FIG. 2)

In the drawing, the hole auxiliary layer 12 and the electron auxiliary layer 14 are formed as a monolayer. However, the hole auxiliary layer 12 and the electron auxiliary layer 14 may be formed of plural layers including two or more stacked layers.

The hole auxiliary layer 12 may include for example a hole injection layer (HIL) to facilitate hole injection, a hole transport layer (HTL) to facilitate hole transport, an electron blocking layer (EBL) to inhibit electron transport, or a combination thereof.

For example, the hole injection layer may be disposed between the hole transport layer and the anode. For example, the electron blocking layer may be disposed between the emission layer and the hole transport (injection) layer, but is not limited thereto. A thickness of each layer may be appropriately selected. For example, each thickness of the layer may be greater than or equal to about 1 nm, greater than or equal to about 5 nm, greater than or equal to about 10 nm, greater than or equal to about 15 nm, greater than or equal to about 20 nm, or greater than or equal to about 25 nm and less than or equal to about 500 nm, less than or equal to about 400 nm, less than or equal to about 300 nm, less than or equal to about 200 nm, less than or equal to about 100 nm, less than or equal to about 90 nm, less than or equal to about 80 nm, less than or equal to about 70 nm, less than or equal to about 60 nm, or less than or equal to about 50 nm, but is not limited thereto. The hole injection layer may be an organic layer formed by a solution process (e.g., spin coating) such as poly(3,4-ethylenedioxythiophene):poly (styrene sulfonate) (PEDOT:PSS). The hole transport layer may also be an organic layer formed by a solution process (e.g., spin coating and the like).

The electron auxiliary layer 14 may include for example an electron injection layer (EIL) to facilitate electron injection, an electron transport layer (ETL) to facilitate electron transport, a hole blocking layer (HBL) to inhibit hole transport, or a combination thereof. For example, the electron injection layer may be disposed between the electron transport layer and the cathode. For example, the hole blocking layer may be disposed between the emission layer and the electron transport (injection) layer, but is not limited thereto. A thickness of each layer may be appropriately selected. For example, a thickness of each layer may be greater than or equal to about 1 nm, greater than or equal to about 5 nm, greater than or equal to about 10 nm, greater than or equal to about 15 nm, greater than or equal to about 20 nm, or greater than or equal to about 25 nm and less than or equal to about 500 nm, less than or equal to about 400 nm, less than or equal to about 300 nm, less than or equal to about 200 nm, less than or equal to about 100 nm, less than or equal to about 90 nm, less than or equal to about 80 nm, less than or equal to about 70 nm, less than or equal to about 60 nm, or less than or equal to about 50 nm, but is not limited thereto. The electron injection layer may be an organic layer formed by deposition. The electron transport layer may include an inorganic oxide or nanoparticles or particulates thereof or may be an organic layer formed by deposition.

The quantum dot emission layer 13 may be disposed in the hole injection (or transport) layer or an electron injection (or transport) layer or on the hole injection (or transport) layer or an electron injection (or transport) layer. The quantum dot emission layer 13 may be disposed as a separate layer between the hole auxiliary layer 12 and the electron auxiliary layer 14.

The charge auxiliary layer, the electron blocking layer, and the hole blocking layer may include for example an organic material, an inorganic material, or an organic/inorganic material. The organic material may be an organic compound having hole or electron-related properties. The inorganic material may be for example a metal oxide such as molybdenum oxide, tungsten oxide, zinc oxide, or nickel oxide, but is not limited thereto.

The hole transport layer (HTL), hole injection layer (HIL), or a combination thereof may include for example poly(3,4-ethylenedioxythiophene):poly(styrene sulfonate) (PEDOT:PSS), poly(9,9-dioctyl-fluorene-co-N-(4-butylphenyl)-diphenylamine) (TFB), polyarylamine, poly (N-vinylcarbazole) (PVK), polyaniline, polypyrrole, N,N,N',N'-tetrakis(4-methoxyphenyl)-benzidine (TPD), 4,4'-bis[N-(1-naphthyl)-N-phenyl-amino]biphenyl (α-NPD), m-MTDATA (4,4',4"-tris[phenyl(m-tolyl)amino]triphenylamine), 4,4',4"-tris(N-carbazolyl)-triphenylamine (TCTA), 1,1-bis[(di-4-tolylamino)phenylcyclohexane (TAPC), a p-type metal oxide (e.g., NiO, $WO_3$, $MoO_3$, etc.), a carbon-based material such as graphene oxide, or a combination thereof, but is not limited thereto.

The electron blocking layer (EBL) may include for example poly(3,4-ethylenedioxythiophene):poly(styrene sulfonate) (PEDOT:PSS), poly(9,9-dioctyl-fluorene-co-N-(4-butylphenyl)-diphenylamine) (TFB) polyarylamine, poly (N-vinylcarbazole), polyaniline, polypyrrole, N, N, N', N'-tetrakis(4-methoxyphenyl)-benzidine (TPD), 4-bis[N-(1-naphthyl)-N-phenyl-amino]biphenyl (α-NPD), m-MT-DATA, 4,4',4"-tris(N-carbazolyl)-triphenylamine (TCTA), or a combination thereof, but is not limited thereto.

The electron transport layer (ETL), the electron injection layer (EIL), or a combination thereof may include for example 1,4,5,8-naphthalene-tetracarboxylic dianhydride (NTCDA), bathocuproine (BCP), tris[3-(3-pyridyl)-mesityl] borane (3TPYMB), LiF, tris(8-hydroxyquinoline) aluminum ($Alq_3$), tris(8-hydroxyquinoline) gallium ($Gaq_3$), tris(8-hydroxyquinoline) indium ($Inq_3$), bis(8-hydroxyquinoline) zinc ($Znq_2$), bis(2-(2-hydroxyphenyl)benzothiazolate) zinc ($Zn(BTZ)_2$), bis(10-hydroxybenzo[h]quinolone) beryllium ($BeBq_2$), 8-(4-(4,6-di(naphthalen-2-yl)-1,3,5-triazin-2-yl)phenyl)quinolone (ET204), 8-hydroxyquinolinato lithium (Liq), an n-type metal oxide (e.g., ZnO, $HfO_2$, etc.), or a combination thereof, but is not limited thereto.

The hole blocking layer (HBL) may include for example 1,4,5,8-naphthalene-tetracarboxylic dianhydride (NTCDA), bathocuproine (BCP), tris[3-(3-pyridyl)-mesityl] borane (3TPYMB), LiF, $Alq_3$, Gaq3, Inq3, Znq2, $Zn(BTZ)_2$, $BeBq_2$, or a combination thereof, but is not limited thereto. Herein, q denotes 8-hydroxyquinoline, BTZ denotes 2-(2-hydroxyphenyl)benzothiazolate, and Bq denotes 10-hydroxybenzo[h]quinolone.

Figure 3:
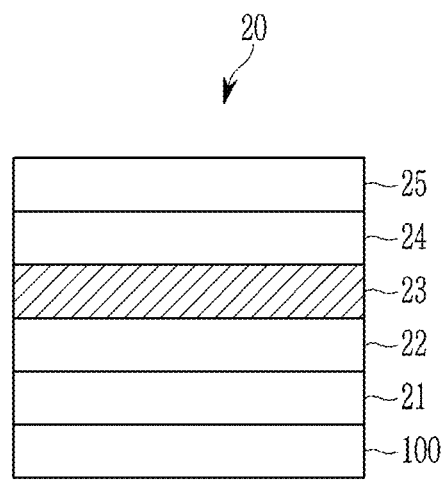
FIG. 3 is a schematic cross-sectional view of a QD LED device according to an embodiment.

FIG. 3 is a schematic cross-sectional view of a QD LED device according to an embodiment.

Referring to FIG. 3, in a QD LED device 20, an anode 21 disposed on a transparent substrate 100 may include a metal oxide-based transparent electrode (e.g., ITO electrode) and a cathode 25 facing the anode 21 may include a metal (Mg, Al, etc.) of a predetermined (relatively low) work function. For example, a hole transport layer including TFB, PVK, or a combination thereof; a hole injection layer including PEDOT:PSS, a p-type metal oxide, or a combination hereof; or a combination thereof may be disposed between the anode 21 and a quantum dot emission layer 23 as a hole auxiliary layer 22. An electron auxiliary layer 24 (e.g., electron transport layer) may be disposed between the quantum dot emission layer 23 and the cathode 25.

A device according to an embodiment has an inverted structure. The QD LED device having such an inverted structure is explained referring to FIG. 4. FIG. 4 is a schematic cross-sectional view of a QD LED device according to an embodiment.

Figure 4:
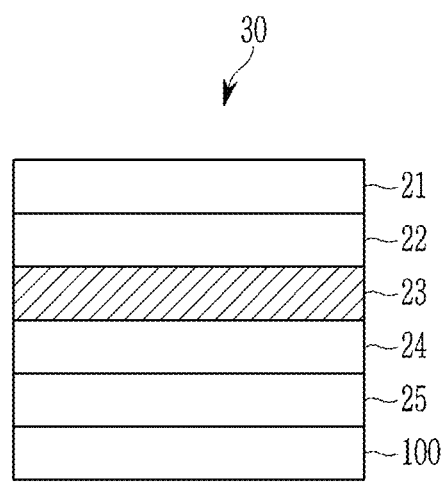
FIG. 4 is a schematic cross-sectional view of a QD LED device according to an embodiment.

Referring to FIG. 4, a QD LED device 30 may include a cathode 25 disposed on a transparent substrate 100 and including a metal oxide-based transparent electrode (e.g., ITO) and an anode 21 facing the cathode 25 and including a metal (e.g., Au, Ag, etc.) of a predetermined (e.g., relatively high) work function. For example, an n-type metal oxide (ZnO) may be disposed between the cathode 25 and the quantum dot emission layer 23 as an electron auxiliary layer 24 (e.g., electron transport layer). A hole auxiliary layer 22 (e.g., hole transport layer including TFB, PVK, or a combination thereof; a hole injection layer including $MoO_3$ or another p-type metal oxide; or a combination thereof) may be disposed between the anode 21 and the quantum dot emission layer 23.

Hereinafter, specific examples are illustrated. However, these examples are exemplary, and the present disclosure is not limited thereto.

Examples

Analysis Method

1. Photoluminescence Analysis

Photoluminescence (PL) spectra of the produced nanocrystals are obtained by using a Hitachi F-7000 spectrometer at an irradiation wavelength of 372 nanometers (nm).

2. Transmission Electron Microscopic (TEM) Analysis (1) Transmission electron microscopic photographs of nanocrystals are obtained by using an UT F30 Tecnai electron microscope.

(2) A transmission electron microscopy-energy dispersive X-ray (TEM-EDX) analysis (elemental mapping) is performed by using an UT F30 Tecnai electron microscope.

Syntheses are performed under inert gas atmospheres (nitrogen flowing conditions), unless particularly mentioned.

Example 1-1: ZnSe:Li Core/ZnS Shell Semiconductor Nanocrystal Particle

Selenium is dispersed in trioctylphosphine (TOP) to obtain a 2 molar (M) Se/TOP stock solution.

A 1 M diethyl zinc hexane stock solution is obtained.

Trioctylamine is put in a 300 milliliter (mL) reaction flask, and then, oleic acid (OA) and oleylamine (OAm) are respectively added thereto in a ratio of 1 mole (mol) and 1.5 mol relative to 1 mol of a zinc precursor (i.e., diethyl zinc) that will be described later. An atmosphere in the flask is converted into nitrogen, and the mixture is heated at 280° C. for 10 minutes to obtain a heat-treated ligand mixture.

The ligand mixture is heated up to 300° C., a diethyl zinc stock solution is injected thereinto, subsequently, the Se/TOP stock solution is injected thereinto, and the obtained mixture is reacted at the same temperature for 40 minutes.

After the reaction, the reaction solution is cooled down to room temperature, ethanol is added thereto, and the obtained mixture is centrifuged to recover ZnSe cores. The recovered ZnSe cores are dispersed in toluene.

Trioctylamine (TOA) is put in a 500 mL reaction flask, zinc acetate and oleic acid are added thereto in a mole ratio of 1:2, lithium palmitate (LiPA) is added thereto in a mole ratio of 1:10 of zinc, and the obtained mixture is vacuum-treated at 120° C. for 10 minutes. The flask is internally substituted with nitrogen ($N_2$) and then, heated up to 280° C. The toluene dispersion of the ZnSe cores is rapidly put therein, and the Zn precursor and the Se/TOP stock solution are added thereto and then, heated up to 340° C. and reacted for one hour. The S/TOP stock solution is additionally added thereto, and the obtained mixture is reacted for one hour more (formation of a ZnS shell).

When the reaction is complete, the reactor is cooled down, and the produced ZnSe:Li core/ZnS shell semiconductor nanocrystal particles are centrifuged with ethanol and dispersed in toluene.

Example 1-2: ZnSe:Na Core/ZnS Shell Semiconductor Nanocrystal Particle

ZnSe:Na core/ZnS shell semiconductor nanocrystal particles are produced according to the same method as Example 1-1 except that sodium oleate (NaOA) is used instead of the lithium palmitate (LiPA).

Example 1-3: ZnSe:K Core/ZnS Shell Semiconductor Nanocrystal Particle

ZnSe:K core/ZnS shell semiconductor nanocrystal particles are produced according to the same method as Example 1-1 except that potassium oleate (KOA) is used instead of the lithium palmitate (LiPA).

Example 1-4: ZnSe:Na Core/ZnS Shell Semiconductor Nanocrystal Particle

ZnSe:Na core/ZnS shell semiconductor nanocrystal particles are produced according to the same method as Example 1-1 except that sodium oleate (NaOA) instead of the lithium palmitate (LiPA) is added in a mole ratio of 1:5 of zinc.

Comparative Example 1-1: ZnSe Core/ZnS Shell Semiconductor Nanocrystal Particle ZnSe core/ZnS shell semiconductor nanocrystal particles are produced according to the same method as Example 1-1 except that the lithium palmitate (LiPA) is not added.

Example 2-1: ZnTeSe:Na Core/ZnS Shell Semiconductor Nanocrystal Particle

Selenium and tellurium are dispersed in trioctylphosphine (TOP) to respectively obtain a 2M Se/TOP stock solution and a 0.1 M Te/TOP stock solution.

A 1 M diethyl zinc hexane stock solution is obtained.

Trioctylamine is put in a 300 mL reaction flask, oleic acid (OA), and oleylamine (OAm) are respectively added in each ratio of 1 mol and 1.5 mol relative to 1 mol of a zinc precursor (i.e., diethyl zinc) that will be described later. After converting an atmosphere in the flask into nitrogen, the flask is heated at 280° C. for 10 minutes to obtain a heat-treated ligand mixture.

After increasing the temperature of the ligand mixture up to 300° C., the diethyl zinc stock solution is injected thereinto, subsequently, the Se/TOP stock solution and the Te/TOP stock solution are injected thereinto in a Te:Se ratio of 1:30, and the obtained mixture is reacted at the same temperature for 40 minutes.

After the reaction, the reaction solution is rapidly cooled down to room temperature, ethanol is added thereto, and the obtained mixture is centrifuged to recover ZnSeTe cores. The recovered ZnSeTe cores are dispersed in toluene.

TOA is put in a 500 mL reaction flask, zinc acetate and oleic acid in a mole ratio of 1:2 are added thereto, sodium oleate (NaOA) is added thereto in a mole ratio of 1:10 of zinc, and the obtained mixture is vacuum-treated at 120° C. for 10 minutes. The flask is internally substituted with nitrogen ($N_2$) and heated up to 280° C. The toluene dispersion of the ZnTeSe cores is rapidly added thereto, the Zn precursor and the Se/TOP stock solution are added thereto, and the obtained mixture is heated up to 340° C. and reacted for 1 hour. Additionally, the S/TOP stock solution is added thereto, and the obtained mixture is reacted for one hour more (formation of a ZnS shell).

When the reaction is all complete, the reactor is cooled down, and the prepared core/shell quantum dots are centrifuged with ethanol and dispersed in toluene.

Example 2-2: ZnTeSe:Na Core/ZnS Shell Semiconductor Nanocrystal Particle

ZnSe:Na core/ZnS shell semiconductor nanocrystal particles are produced according to the same method as Example 2-1 except that the reaction scale is 5 times increased.

Example 2-3: ZnTeSe:Na Core/ZnS Shell Semiconductor Nanocrystal Particle

ZnSe:Na core/ZnS shell semiconductor nanocrystal particles are produced according to the same method as Example 2-1 except that sodium oleate (NaOA) is added in a mole ratio of 1:5 of zinc.

Comparative Example 2-1: ZnTeSe Core/ZnS Shell Semiconductor Nanocrystal Particle ZnTeSe core/ZnS shell semiconductor nanocrystal particles are produced according to the same method as Example 2-1 except that sodium oleate (NaOA) is not added.

A photoluminescence analysis (a PL result and a full width at half maximum (FWHM)) of the semiconductor nanocrystal particles according to Examples 1-1 to 2-4 are performed. The results are shown in Table 1. For comparison, photoluminescence analysis results of ZnSe cores and ZnTeSe cores are shown in Table 1.

TABLE 1

| | Semiconductor nanocrystal particle | PL @ 372 nm (nm) | Full width at half maximum (FWHM) (nm) |
|---|---|---|---|
| Core of Example 1-1 | ZnSe core | 385 | 15 |
| Example 1-1 | ZnSe:Li/ZnS core/shell | 442 | 11 |
| Example 1-2 | ZnSe:Na/ZnS core/shell | 448 | 12 |
| Example 1-3 | ZnSe:K/ZnS core/shell | 450 | 13 |
| Example 1-4 | ZnSe:Na/ZnS core/shell | 450 | 12 |
| Core of Example 2-1 | ZnTeSe core | 432 | 84 |
| Example 2-1 | ZnTeSe:Na/ZnS core/shell | 451 | 16 |
| Example 2-2 | ZnTeSe:Na/ZnS core/shell | 450 | 18 |
| Example 2-3 | ZnTeSe:Na/ZnS core/shell | 455 | 18 |

Referring to Table 1, maximum emission peaks of the core/shell semiconductor nanocrystal particles according to Examples 1-1 to 1-4 are largely shifted by 57 nm to 65 nm toward a long wavelength region compared with the ZnSe core, and full widths at half maximum (FWHM) thereof are greatly reduced. In addition, maximum emission peaks of the core/shell semiconductor nanocrystal particles according to Examples 2-1 to 2-3 are largely shifted by 18 nm to 23 nm toward a long wavelength region, and full widths at half maximum (FWHM) thereof are greatly reduced.

Quantum efficiency and Stokes shifts of the semiconductor nanocrystal particles according to Examples 1-2 to 1-4 and 2-1 to 2-3 are measured, and the results are shown in Table 2.

The Stokes shifts are obtained by calculating a difference between a band edge absorption wavelength in a UV absorption spectrum and a maximum light emitting wavelength in a PL light emitting spectrum.

TABLE 2

| | Semiconductor nanocrystal particle | Quantum efficiency (%) | Stokes shift |
|---|---|---|---|
| Comparative Example 1-1 | ZnSe/ZnS core/shell | 61 | 21 nm (0.14 electronvolts (eV)) |
| Example 1-2 | ZnSe:Na/ZnS core/shell | 84 | 28 nm (0.18 eV) |
| Example 1-3 | ZnSe:K/ZnS core/shell | 81 | 30 nm (0.20 eV) |
| Example 1-4 | ZnSe:Na/ZnS core/shell | 77 | 30 nm (0.20 eV) |
| Comparative Example | 2-1 ZnTeSe/ZnS core/shell | 70 | 25 nm (0.17 eV) |
| Comparative Example | 2-1 ZnTeSe/ZnS core/shell | 84 | 31 nm (0.20 eV) |
| Example 2-2 | ZnTeSe:Na/ZnS core/shell | 90 | 30 nm (0.20 eV) |
| Example 2-3 | ZnTeSe:Na/ZnS core/shell | 78 | 35 nm (0.23 eV) |

Referring to Table 2, the semiconductor nanocrystal particles according to Examples 1-2 to 1-4 and Examples 2-1 to 2-3 exhibit higher quantum efficiency than the ZnSe/ZnS core/shell semiconductor nanocrystal particles according to Comparative Example 1-1 and the ZnTeSe/ZnS core/shell semiconductor nanocrystal particles according to Comparative Example 2-1. In Table 2, Examples 1-2 to 1-4 exhibit a different Stokes shift form that of Comparative Example 1-1, and Examples 2-1 to 2-3 exhibit a different Stokes shift form that of Comparative Example 2-1, which means that a light-emitting mechanism is changed by the doping of a core.

Figure 5:
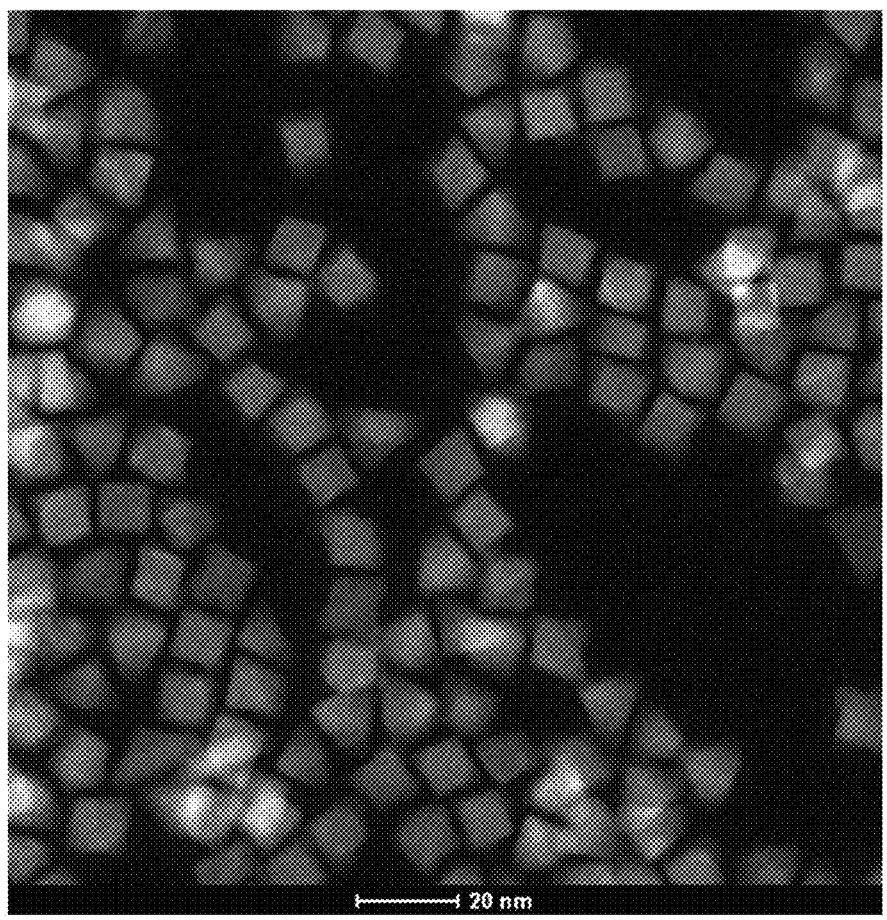
FIG. 5 shows a transmission electron microscopic (TEM) image of the semiconductor nanocrystal particle according to Example 2-2.

A transmission electron microscopic image of the semiconductor nanocrystal particles according to Example 2-2 is shown in FIG. 5. The transmission electron microscopic analysis result of FIG. 5 confirms that mostly polygonal particles are formed.

While this disclosure has been described in a connection with what is presently considered to be practical example embodiments, it is to be understood that the invention is not limited to the disclosed embodiments, but, on the contrary, is intended to cover various modifications and equivalent arrangements included within the spirit and scope of the appended claims.

DESCRIPTION OF SYMBOLS

| | |
|---|---|
| 1: semiconductor nanocrystal particle | 3: core |
| 5: shell | 11, 21: anode |
| 13, 23: quantum dot emission layer | 15, 25: cathode |
| 12, 22: hole auxiliary layer | 14, 24: electron auxiliary layer |
| 10, 20, 30: QD LED device | 100: substrate |

What is claimed is:

1. A semiconductor nanocrystal particle, comprising
a core comprising
a first semiconductor nanocrystal comprising
zinc and sulfur, or
zinc and selenium, or
zinc and tellurium, or
zinc, sulfur, and selenium, or
zinc, sulfur, and tellurium, or
zinc, selenium, and tellurium, or
zinc, sulfur, selenium, and tellurium; and
a shell comprising a second semiconductor nanocrystal disposed on at least a portion of the core,
wherein the core comprises a dopant of
a Group 1A element, or
a Group 2A element, or
a Group 1A element and a Group 2A element, and
the semiconductor nanocrystal particle exhibits a maximum peak emission in a wavelength region of about 440 nanometers to about 470 nanometers.

2. The semiconductor nanocrystal particle of claim 1, wherein a mole ratio of the dopant relative to the zinc is less than or equal to about 0.03:1.

3. The semiconductor nanocrystal particle of claim 1, wherein a content of the dopant is less than or equal to about 0.1 weight percent, based on a total weight of the semiconductor nanocrystal particle.

4. The semiconductor nanocrystal particle of claim 1, wherein a size of the core ranges from about 3 nanometers to about 15 nanometers.

5. The semiconductor nanocrystal particle of claim 1, wherein the first semiconductor nanocrystal comprises
a semiconductor nanocrystal comprising zinc and selenium; or
a semiconductor nanocrystal comprising zinc, selenium, and tellurium; or
a semiconductor nanocrystal comprising zinc, sulfur, and selenium; or
a semiconductor nanocrystal comprising zinc, sulfur, and tellurium; or
a semiconductor nanocrystal comprising zinc, sulfur, selenium, and tellurium.

6. The semiconductor nanocrystal particle of claim 1, wherein the second semiconductor nanocrystal comprises a Group II-VI compound, or a Group III-V compound, or a Group IV-VI compound, or a Group IV element or compound, or a Group compound, or a Group I-II-IV-VI compound.

7. The semiconductor nanocrystal particle of claim 1, wherein the second semiconductor nanocrystal comprises
zinc and sulfur; or
zinc and selenium; or
zinc and tellurium; or
zinc, sulfur, and selenium; or
zinc, sulfur, and tellurium; or
zinc, selenium, and tellurium; or
zinc, sulfur, selenium, and tellurium.

8. The semiconductor nanocrystal particle of claim 1, wherein the shell comprises a plurality of layers and adjacent layers of the plurality of layers comprise different semiconductor nanocrystals.

9. The semiconductor nanocrystal particle of claim 1, wherein the shell comprises more than two layers and adjacent layers comprise different semiconductor nanocrystals.

10. The semiconductor nanocrystal particle of claim 8, wherein the shell comprises
a first layer disposed directly on the core and
an outermost layer,
wherein the first layer comprises ZnSeS and the outermost layer comprises ZnS.

11. The semiconductor nanocrystal particle of claim 1, wherein the maximum peak emission has a full width at half maximum of less than or equal to about 30 nanometers.

12. The semiconductor nanocrystal particle of claim 1, wherein the semiconductor nanocrystal particle has quantum efficiency of greater than or equal to about 60%.

13. The semiconductor nanocrystal particle of claim 1, wherein the semiconductor nanocrystal particle has a size of greater than or equal to about 4 nanometers to about 50 nanometers.

14. The semiconductor nanocrystal particle of claim 1, wherein the semiconductor nanocrystal particle does not comprise cadmium.

15. A method of producing the semiconductor nanocrystal particle of claim 1, comprising
preparing a first core precursor solution comprising a zinc precursor and a first organic ligand;
preparing a second core precursor comprising sulfur, selenium, tellurium, or a combination thereof;
preparing a first shell precursor solution comprising a first shell precursor comprising a metal and a second organic ligand;
preparing a second shell precursor comprising a non-metal element;
heating the first core precursor solution to a first reaction temperature;
adding the second core precursor, and optionally a third organic ligand to the first core precursor solution to form the core and obtain a first mixture;
adding a dopant precursor comprising the dopant, and optionally a fourth organic ligand to the first mixture to obtain a second mixture;
heating the second mixture to a second reaction temperature;
adding the core, the second core precursor, and optionally a fifth organic ligand to the second mixture to grow the core;
combining the first shell precursor solution, the second shell precursor, and the core; and
reacting the first shell precursor solution, the second shell precursor, and the core to form the shell and produce the semiconductor nanocrystal particle.

16. The method of claim 15, further comprising
separating the core from the first mixture and
dispersing the core in an organic solvent to prepare a core solution.

17. The method of claim 15, wherein the zinc precursor comprises a Zn metal powder, or ZnO, or an alkylated Zn compound, or a Zn alkoxide, or a Zn carboxylate, or a Zn nitrate, or a Zn perchlorate, or a Zn sulfate, or a Zn acetylacetonate, or a Zn halide, or a Zn cyanide, or a Zn hydroxide, and
the second core precursor comprises
an alkyl phosphine comprising sulfur, or selenium, or tellurium or
an aryl phosphine comprising sulfur, or selenium, or tellurium.

18. The method of claim 15, wherein
the first shell precursor comprises zinc and
the second shell precursor comprises sulfur, or selenium, or tellurium.

19. The method of claim 15, wherein the organic ligand comprises RCOOH, or $RNH_2$, or $R_2NH$, or $R_3N$, or RSH, or $RH_2PO$, or $R_2HPO$, or $R_3PO$, or $RH_2P$, or $R_2HP$, or $R_3P$, or ROH, or RCOOR, or $RPO(OH)_2$, or RHPOOH, or $R_2POOH$, or a mixture thereof, wherein each R is the same or different and is independently hydrogen, a C1 to C24 substituted or unsubstituted aliphatic hydrocarbon, a C6 to C20 substituted or unsubstituted aromatic hydrocarbon, or a combination thereof, provided that at least one R is not hydrogen.

20. An electronic device comprising the semiconductor nanocrystal particle of claim 1.

* * * * *